United States Patent
Shank et al.

(10) Patent No.: US 12,243,923 B2
(45) Date of Patent: Mar. 4, 2025

(54) CONTACT-OVER-ACTIVE-GATE TRANSISTOR STRUCTURES WITH CONTACTS LANDED ON ENLARGED GATE PORTIONS

(71) Applicant: GLOBALFOUNDRIES U.S. Inc., Malta, NY (US)

(72) Inventors: Steven M. Shank, Jericho, VT (US); Anthony K. Stamper, Williston, VT (US); Venkata N. R. Vanukuru, Karnataka (IN); Mark Levy, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 574 days.

(21) Appl. No.: 17/506,992

(22) Filed: Oct. 21, 2021

(65) Prior Publication Data

US 2023/0125886 A1  Apr. 27, 2023

(51) Int. Cl.
*H01L 29/423* (2006.01)
*H01L 29/08* (2006.01)
*H01L 29/10* (2006.01)

(52) U.S. Cl.
CPC ...... *H01L 29/4236* (2013.01); *H01L 29/0847* (2013.01); *H01L 29/1079* (2013.01)

(58) Field of Classification Search
None
See application file for complete search history.

(56) References Cited

U.S. PATENT DOCUMENTS

| | | | |
|---|---|---|---|
| 10,424,664 B2 | 9/2019 | Ellis-Monaghan | |
| 10,573,724 B2 | 2/2020 | Cheng | |
| 2008/0265290 A1* | 10/2008 | Nielsen | H01L 29/785 257/288 |
| 2012/0001271 A1* | 1/2012 | Chae | H01L 23/535 257/E27.06 |
| 2019/0386103 A1* | 12/2019 | Do | H01L 29/7827 |
| 2020/0373410 A1 | 11/2020 | Lee et al. | |

OTHER PUBLICATIONS

Steven M. Shank et al., "Gate Contacts With Airgap Isolation", filed Jun. 29, 2021 as U.S. Appl. No. 17/361,848.
A. Razavieh et al., "FinFET with Contact over Active-Gate for 5G Ultra-Wideband Applications," 2020 IEEE Symposium on VLSI Technology, 2020, pp. 1-2.

* cited by examiner

*Primary Examiner* — Cory W Eskridge
(74) *Attorney, Agent, or Firm* — Thompson Hine LLP; Francois Pagette

(57) ABSTRACT

Structures for a transistor including regions for landing gate contacts and methods of forming a structure for a transistor that includes regions for landing gate contacts. The structure includes a field-effect transistor having a source region, a gate region, a gate with a sidewall, and a gate extension with a section adjoined to the sidewall. The structure further includes a dielectric layer over the field-effect transistor, and a gate contact positioned in the dielectric layer to land on at least the section of the gate extension.

17 Claims, 18 Drawing Sheets

CONTACT-OVER-ACTIVE-GATE TRANSISTOR STRUCTURES WITH CONTACTS LANDED ON ENLARGED GATE PORTIONS

BACKGROUND

The present invention relates to semiconductor device fabrication and integrated circuits and, more specifically, to structures for a transistor including regions for landing gate contacts and methods of forming a structure for a transistor that includes regions for landing gate contacts.

A low-noise amplifier is an electronic amplifier that is capable of amplifying a low-power signal without significantly degrading its signal-to-noise ratio. A low-noise amplifier includes one or more field-effect transistors in its construction. For certain applications, a reduced gate resistance is needed to improve the noise figure, particularly at frequencies through 30 gigahertz. Contacts placed over the gate within the active region of a field-effect transistor may be effective to reduce the gate resistance. However, as gate widths shrink in advanced technology nodes, contact dimensions become larger than gate dimensions. The inability to fully land a contact on a gate due to size mismatch and overlay tolerances may cause shorting and performance issues.

Structures for a transistor including regions for landing gate contacts and methods of forming a structure for a transistor that includes regions for landing gate contacts are needed.

SUMMARY

In an embodiment of the invention, a structure includes a field-effect transistor having a source region, a drain region, a gate with a sidewall, and a gate extension with a section adjoined to the sidewall. The structure further includes a dielectric layer over the field-effect transistor, and a gate contact positioned in the dielectric layer to land on at least the section of the gate extension.

In an embodiment of the invention, a structure includes a field-effect transistor having a source region, a drain region, a first gate with a first sidewall, a second gate with a second sidewall adjacent to the first sidewall of the first gate, and a gate extension extending from the first sidewall of the first gate to the second sidewall of the second gate. The structure further includes a shallow trench isolation region positioned beneath the gate extension.

In an embodiment of the invention, a method of forming a field-effect transistor is provided. The method includes forming a gate and a gate extension having a section adjoined to a sidewall of the gate, forming a source region and a drain region, forming a dielectric layer over the gate, the gate extension, the source region, and the drain region, and forming a gate contact in the dielectric layer. The gate contact is positioned in the dielectric layer to land on at least the section of the gate extension.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
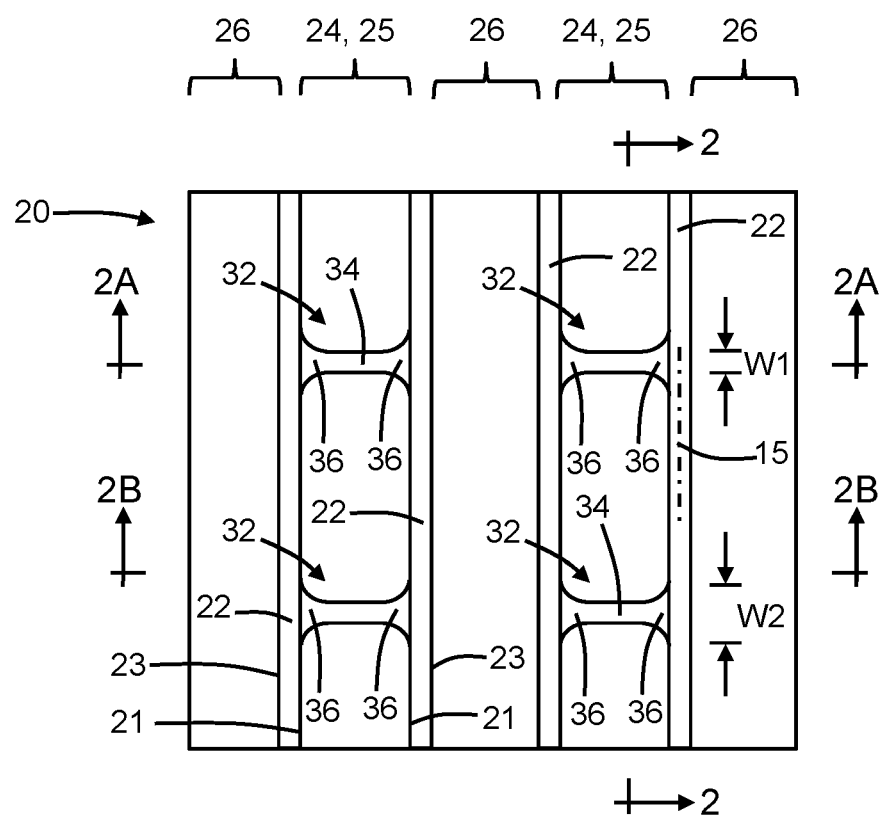
FIG. 1 is a top view of a structure at an initial fabrication stage of a processing method in accordance with embodiments of the invention.

With reference to FIG. 1, 2, 2A, 2B and in accordance with embodiments of the invention, a field-effect transistor 20 may be fabricated by front-end-of-line processing as a device structure in an active region of a substrate 10. The substrate 10 may be comprised of a semiconductor material, such as single-crystal silicon. In an embodiment, the substrate 10 may be the device layer of a silicon-on-insulator (SOI) substrate that further includes a handle substrate and a buried oxide (BOX) layer electrically isolating the device layer from the handle substrate. Alternatively, the substrate 10 may be a bulk semiconductor substrate.

The field-effect transistor 20 may include gates 22 positioned with a given pitch on the substrate 10, as well as source regions 24 and drain regions 26 that may are positioned in a well 28. The well 28 may be formed by ion implantation of a dopant having an opposite conductivity type from the source regions 24 and drain regions 26. A channel region is arranged in the substrate 10 beneath each gate 22 as a portion of the well 28 that is laterally between the adjacent source region 24 and the adjacent drain region 26. The field-effect transistor 20 may include other features such as a gate dielectric 30 positioned between the gates 22 and the substrate 10 and between the gate extensions 32 and the substrate 10, and sidewall spacers (not shown) on the sidewalls of the gates 22. In an embodiment, the field-effect transistor 20 may be deployed in a low-noise amplifier found in a radio-frequency integrated circuit.

Each gate 22 is laterally positioned between one of the source regions 24 and one of the drain regions 26. In that regard, each gate 22 includes a sidewall 21 that is adjacent to one of the source regions 24 and an opposite sidewall 23 that is adjacent to one of the drain regions 26. Each source region 24 is laterally positioned between the sidewalls 21 of adjacent pairs of gates 22, and each drain region 24 is laterally positioned between the sidewalls 21 of different adjacent pairs of gates 22. Each gate 22 may be lengthwise aligned along a longitudinal axis 15 such that its sidewalls 21 are aligned parallel to the longitudinal axis 15.

Adjacent pairs of gates 22 are connected by gate extensions 32, which bridge between the adjacent pairs of gates 22 across the intervening source region 24. In an embodiment, the gate extensions 32 may be aligned transverse to the gates 22. Each gate extension 32 includes a central section 34 and enlarged sections 36 that are positioned at the opposite ends of the central section 34. The enlarged sections 36 of each gate extension 32 are appended or adjoined to the sidewalls 21 of the adjacent gates 22. The enlarged sections 36 are laterally positioned between the central section 34 and the sidewalls 21 of the adjacent gates 22. Each drain region 26 is laterally positioned between the sidewalls 23 of adjacent gates 22.

Each gate extension 32 has a width dimension that varies along its length with the greatest width occurring at the intersection with the gate sidewall 21. The central section 34 has a width dimension equal to a width W1, and each enlarged section 36 has a width dimension that increases from the width W1 at the intersection with the central section 34 to a width W2 at the intersection with the sidewall 21 of the gate 22. In an embodiment, the width dimension of each enlarged section 36 decreases with increasing distance from the sidewall 21. In an embodiment, the enlarged sections 36 may have a concave curvature such that the width increase is non-linear.

The gates 22 and gate extensions 32 may be formed, for example, by patterning a deposited layer of heavily-doped polysilicon with lithography and etching processes. The enlarged sections 36 are formed during the patterning process.

The source regions 24 and drain regions 26 are doped to have the same conductivity type. The source regions 24 and drain regions 26 may be formed by self-aligned ion implantation of a dopant (e.g., an n-type dopant) with given implantation conditions into the substrate 10. The implantation conditions (e.g., ion species, dose, kinetic energy) may be selected to tune the electrical and physical characteristics of the source regions 24 and drain regions 26. The source regions 24 and drain regions 26 may be comprised of semiconductor material of the substrate 10 that is doped to have an opposite conductivity type from the conductivity type of the well 28. In an embodiment in which the well 28 is doped to have p-type conductivity, the source regions 24 and drain regions 26 may contain semiconductor material that is doped (e.g., heavily doped) with an n-type dopant (e.g., phosphorus and/or arsenic) to provide n-type conductivity.

Body contact regions 25 are longitudinally distributed within each source region 24. The body contact regions 25 may be formed by introducing a dopant by, for example, ion implantation with given implantation conditions into the substrate 10. A patterned implantation mask may be formed to define selected areas (e.g., location and horizontal dimensions) within the source regions 24 that is exposed for implantation to form the body contact regions 25. The implantation mask may include a layer of a material, such as an organic photoresist, having a thickness and stopping power sufficient to block implantation of the masked areas. The implantation conditions (e.g., ion species, dose, kinetic energy) may be selected to tune the electrical and physical characteristics of the body contact regions 25. The body contact regions 25 are doped to have an opposite conductivity type from the source regions 24 and drain regions 26, and the same conductivity type as the well 28. In an embodiment in which the source regions 24 and drain regions 26 are doped to have n-type conductivity, the body contact regions 25 may be doped (e.g., heavily doped) with a p-type dopant (e.g., boron) that provides p-type conductivity.

The gates 22 and gate extensions 32 are positioned over portions of the well 28 during the formation of the source regions 24, the body contact regions 25, and the drain regions 26. The conductivity type of these covered portions of the well 28 beneath the gates 22 and gate extensions 32 is preserved. The gates 22 may be doped concurrently during the formation of the source regions 24 and drain regions 26 to have the same conductivity type as the source regions 24 and drain regions 26. The enlarged sections 36 of each gate extension 32 may also be doped to have the same conductivity type as the source regions 24 and drain regions 26. However, the central section 34 of each gate extension 32 is doped to have the same conductivity type as the body contact regions 25 and an opposite conductivity type from the source regions 24 and drain regions 26.

Each enlarged section 36 is adjoined to one of the gates 22. Each enlarged section 36 locally enlarges the size (e.g., surface area) of the adjoined gate 22. The size enlargement facilitates the landing of gate contacts that are subsequently formed by middle-of-line processing. The width of the gate 22 may be reduced to be smaller than the dimensions of the subsequently-formed gate contacts. Consequently, the reduction in gate width may increase the device gain without adversely affecting the ability to successfully land gate contacts over the active region. By effectively landing contacts on each gate 22 via the enlarged sections 36 as subsequently described, the overall gate resistance is reduced.

Figure 2:
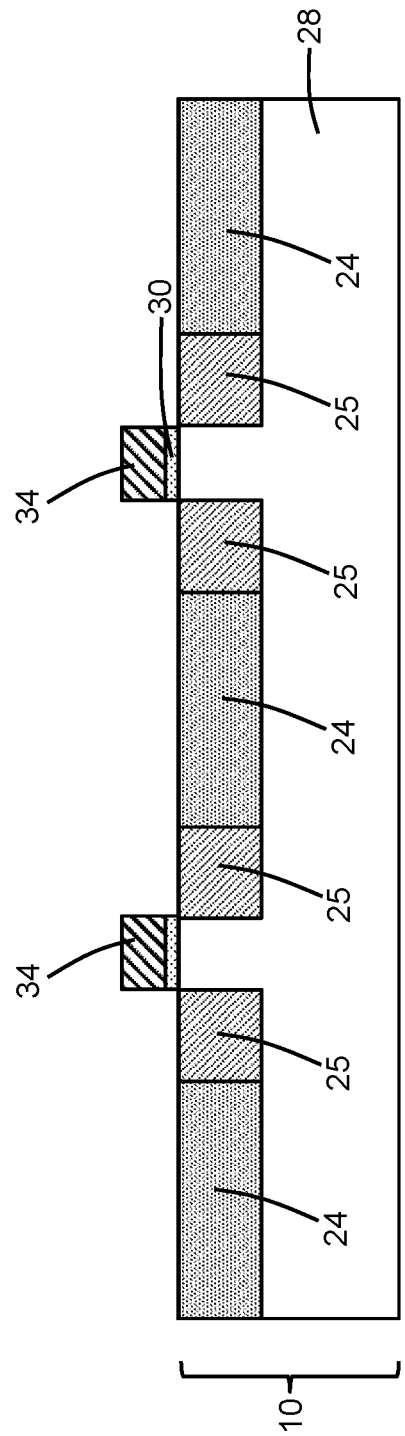
FIG. 2 is a cross-sectional view of the structure taken generally along line 2-2 in FIG. 1.
Figure 2A:
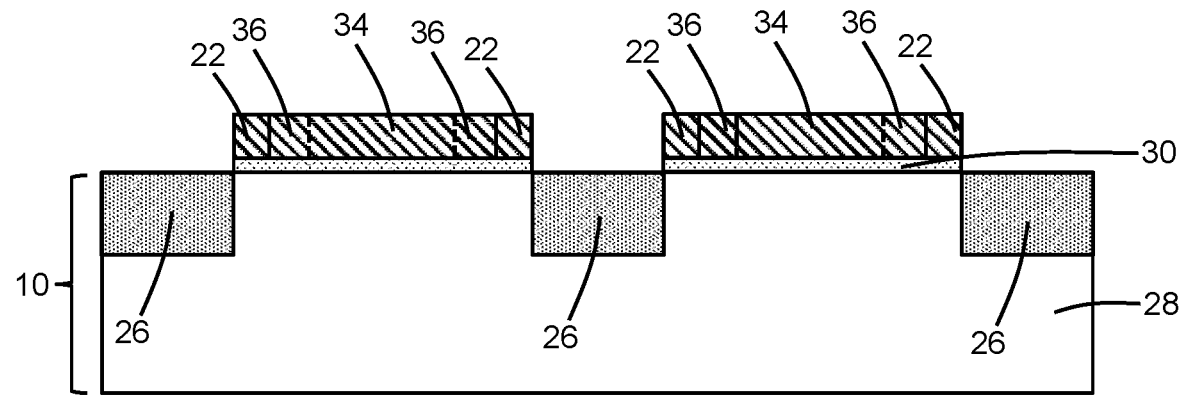
FIG. 2A is a cross-sectional view of the structure taken generally along line 2A-2A in FIG. 1.
Figure 2B:
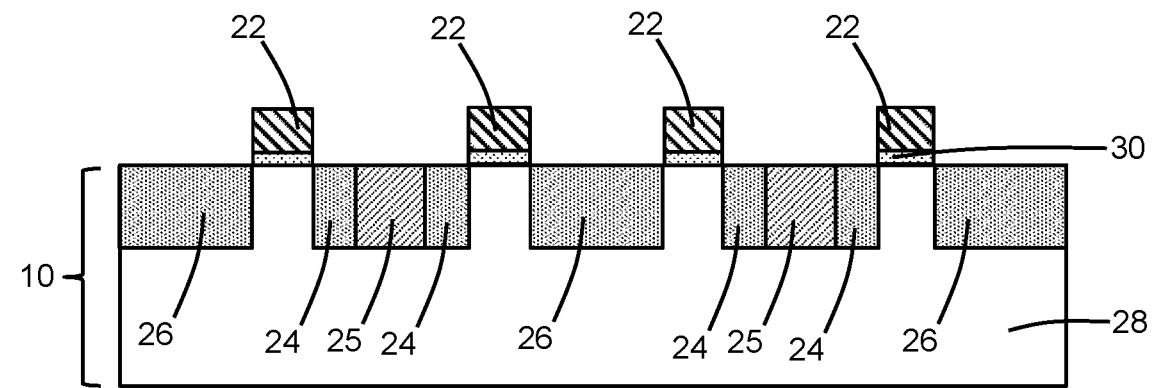
FIG. 2B is a cross-sectional view of the structure taken generally along line 2B-2B in FIG. 1.
Figure 3:
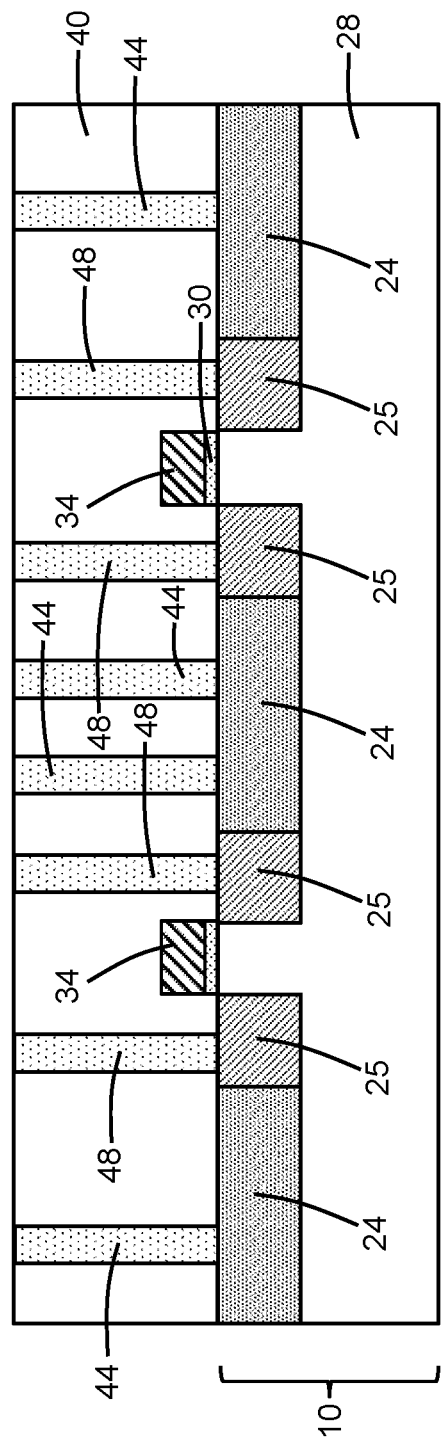
FIGS. 3, 3A, and 3B are cross-sectional views of the structure at a fabrication stage of the processing method subsequent to FIGS. 2, 2A, and 2B.
Figure 3A:
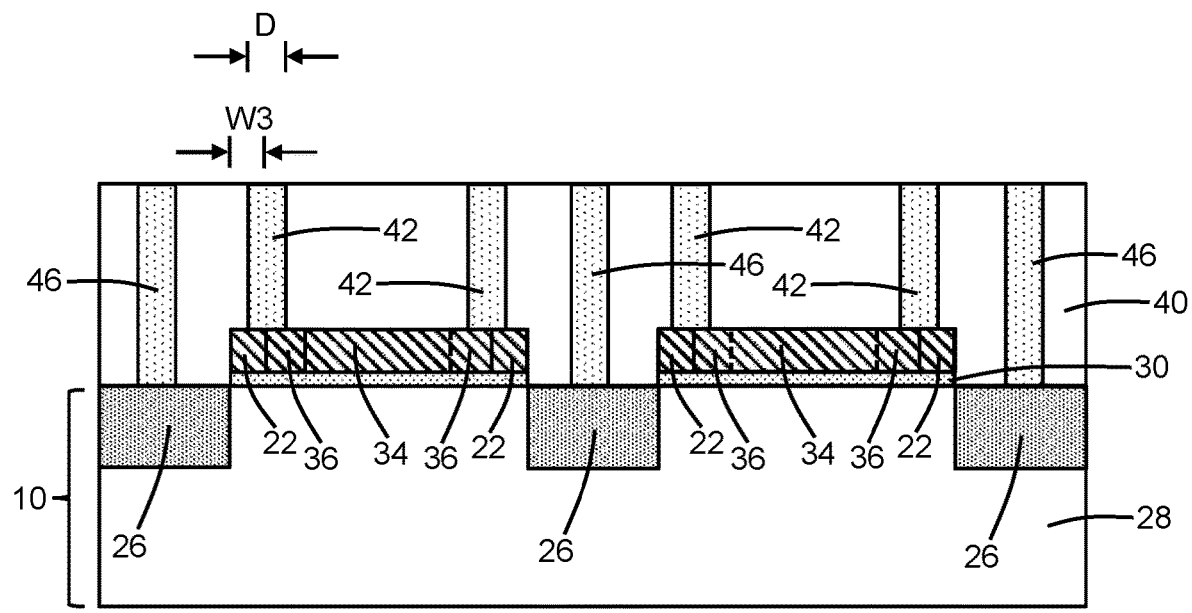
Figure 3B:
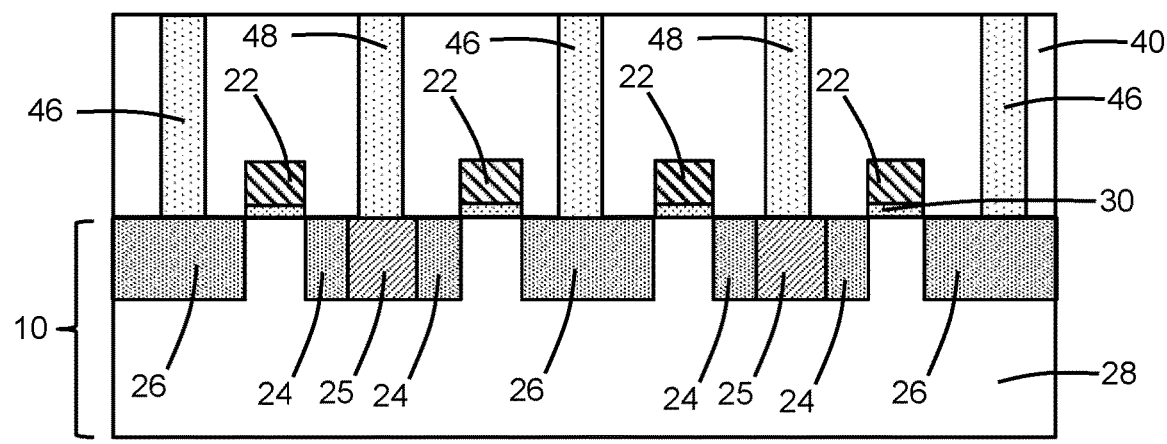

With reference to FIGS. 3, 3A, 3B in which like reference numerals refer to like features in FIGS. 2, 2A, 2B and at a subsequent fabrication stage of the processing method, a local interconnect structure or contact level is formed by middle-of-line processing over the field-effect transistor 20. The local interconnect structure includes a dielectric layer 40, as well as gate contacts 42, source contacts 44, drain contacts 46, and body contacts 48 that are arranged in the dielectric layer 40. The dielectric layer 40 may be comprised of silicon dioxide, and the gate contacts 42, source contacts 44, drain contacts 46, and body contacts 48 may include tungsten, a metal silicide, etc. The source contacts 44 penetrate through the dielectric layer 40 to land at a series of locations on respective surface areas of each source region 24. The drain contacts 46 penetrate through the dielectric layer 40 to land at a series of locations on respective surface areas of each drain region 26.

The gate contacts 42, which are located over the active region, penetrate through the dielectric layer 40 to land at a series of positions or locations that may be jointly located on a respective surface area of each gate 22 and the enlarged sections 36 of each gate extension 32. Each gate contact 42 may have a dimension D that is greater than the width W3 of the gate 22 on which it is landed. In an embodiment, each gate contact 42 may have a portion that is in electrical and physical contact with the gate 22 and a portion that is in electrical and physical contact with the adjacent enlarged section 36 of the gate extension 32. In an alternative embodiment, each gate contact 42 may only have a portion that is in electrical and physical contact with one of the enlarged sections 36 of the gate extension 32.

Back-end-of-line processing is used to form a metallization level of a back-end-of-line interconnect structure that is coupled by the gate contacts 42, source contacts 44, drain contacts 46, and body contacts 48 to the field-effect transistor 20.

Figure 4:
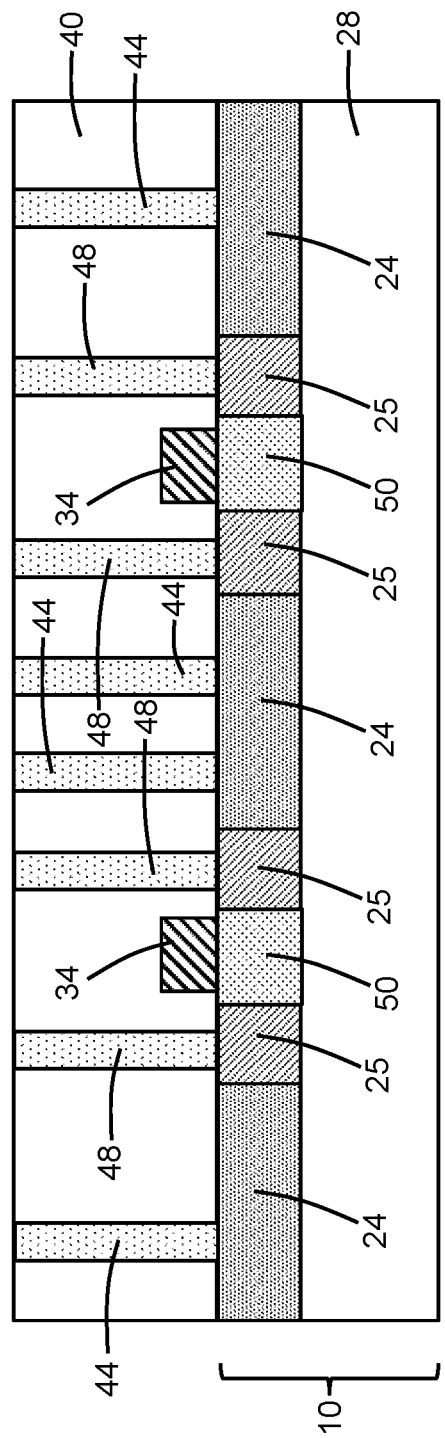
FIGS. 4, 4A, and 4B are cross-sectional views of a structure in accordance with alternative embodiments of the invention.
Figure 4A:
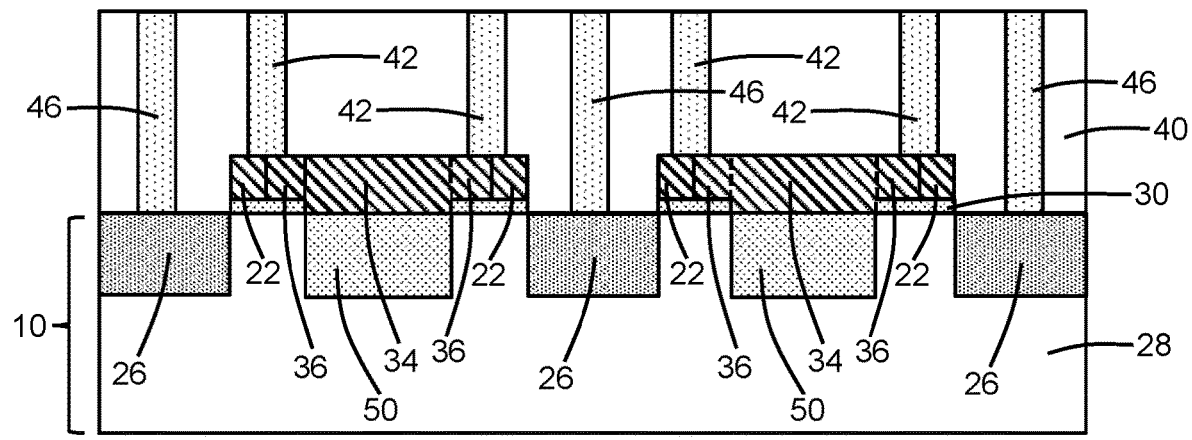
Figure 4B:
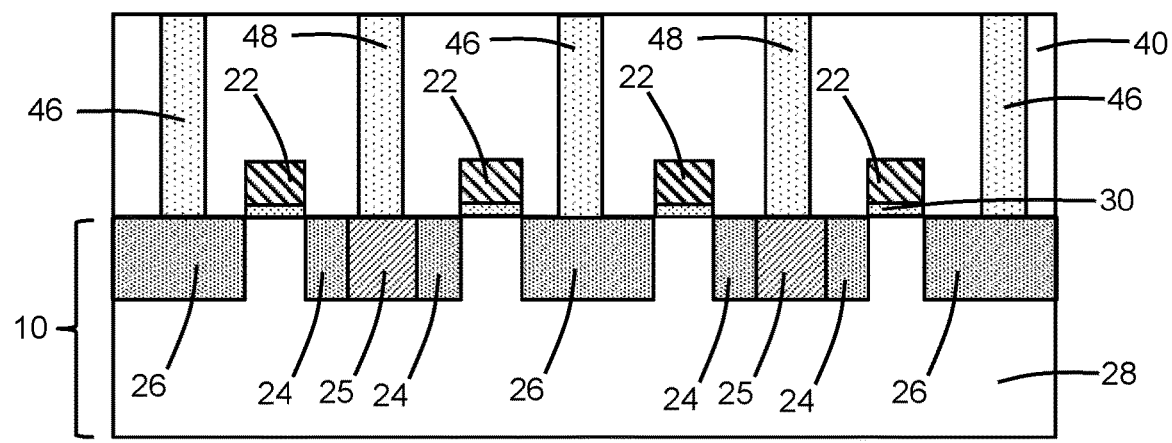
Figure 5:
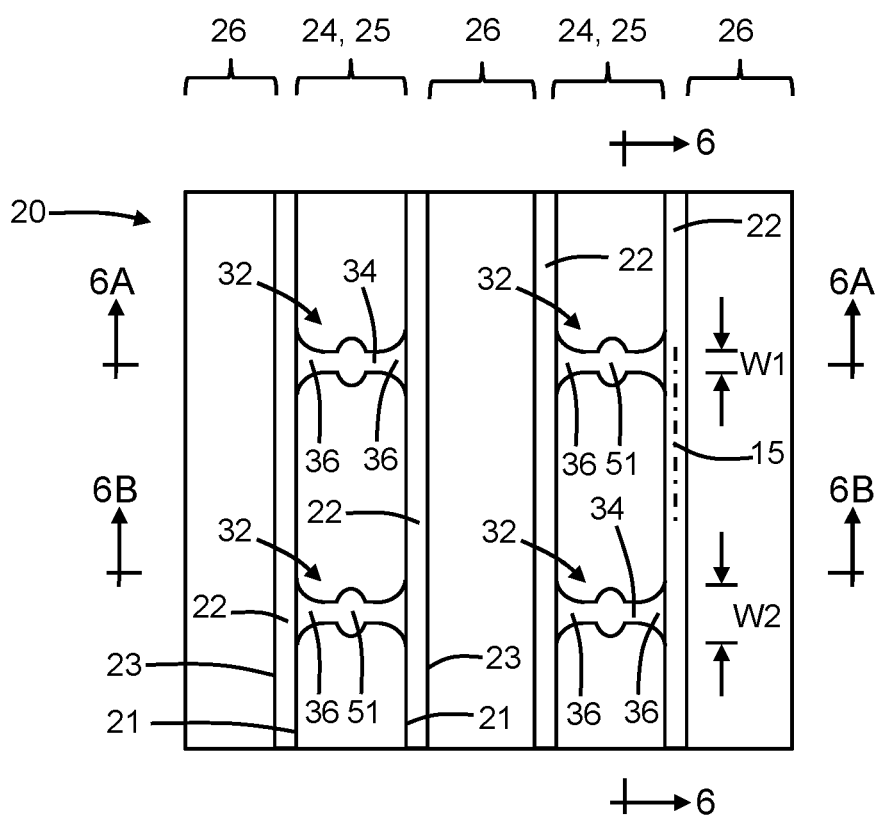
FIG. 5 is a top view of a structure at an initial fabrication stage of a processing method in accordance with embodiments of the invention.

With reference to FIGS. 4, 4A, 4B and in accordance with alternative embodiments of the invention, shallow trench isolation regions 50 may be positioned in the substrate 10 beneath the gate extensions 32. In an embodiment, the shallow trench isolation regions 50 may be positioned in the substrate 10 beneath the central section 34 of each gate extension 32. In an embodiment, one of the shallow trench isolation regions 50 is positioned in the substrate 10 only beneath the central section 34 of each gate extension 32. In an embodiment, the gate dielectric 30 is absent beneath the central section 34 of each gate extension 32 such that the central section 34 and the shallow trench isolation region 50 are positioned in direct contact.

The shallow trench isolation regions 50 may be formed by a shallow trench isolation technique that patterns trenches in the substrate 10 with lithography and etching processes, deposits a dielectric material to overfill the trenches, and planarizes the dielectric material using chemical mechanical polishing and/or an etch back to remove excess dielectric material from the field. The dielectric material may be comprised of an electrical insulator, such as silicon dioxide, deposited by chemical vapor deposition.

The introduction of the shallow trench isolation regions 50 beneath the gate extensions 32 may be effective to enhance device performance, such as by providing a higher gain.

With reference to FIGS. 5, 6, 6A, 6B and in accordance with alternative embodiments of the invention, the gate extensions 32 may be modified to add an enlarged section 51 to the central sections 34. In that regard, each added enlarged section 51 is laterally positioned between the enlarged sections 36 that adjoin the sidewalls 21 of the adjacent gates 22. In an embodiment, the added enlarged section 51 may be equidistant from the adjacent gates 22 and the adjacent enlarged sections 36. The width dimension of the enlarged sections 51 is greater than the width W1 of the central section 34, which may facilitate the ability to fully land a gate contact on the central section 34 of each gate extension 32.

Figure 6:
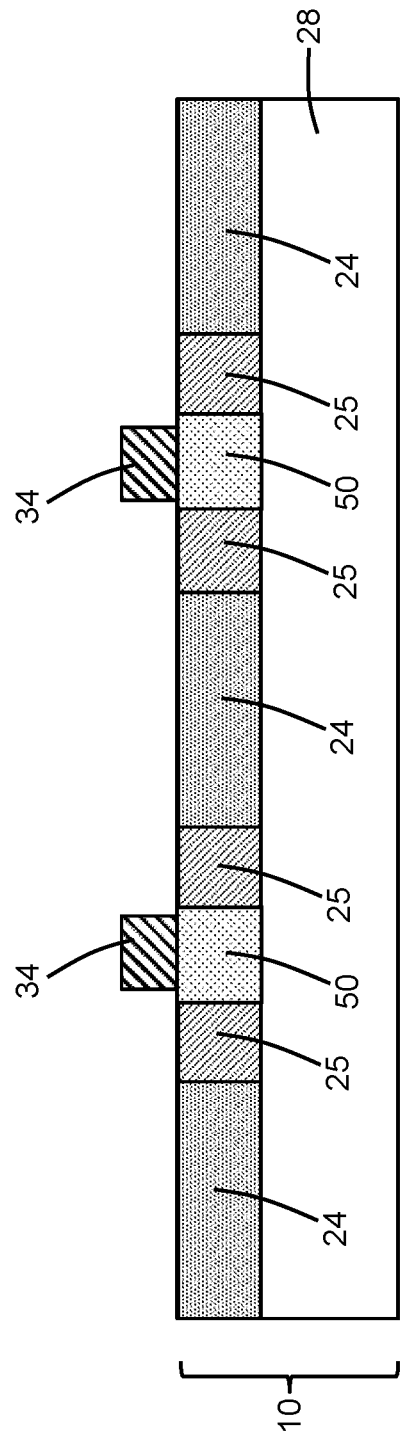
FIG. 6 is a cross-sectional view of the structure taken generally along line 6-6 in FIG. 5.
Figure 6A:
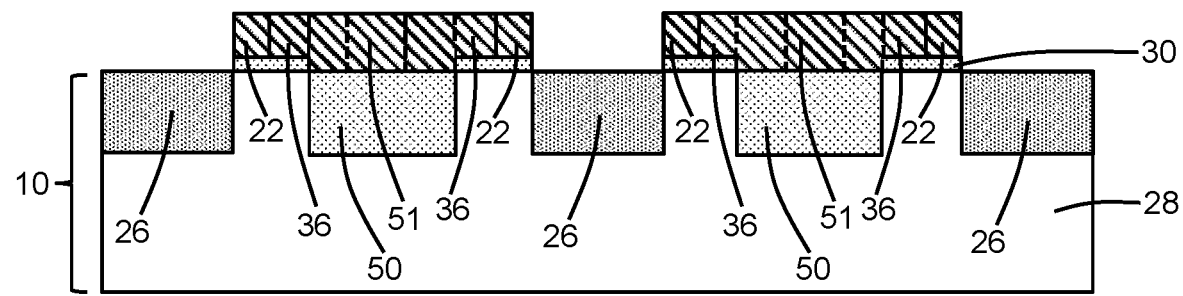
FIG. 6A is a cross-sectional view of the structure taken generally along line 6A-6A in FIG. 5.
Figure 6B:
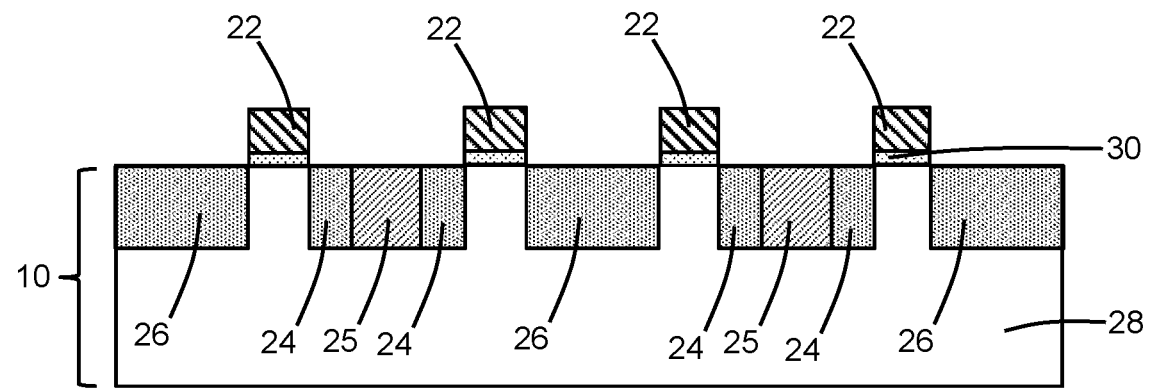
FIG. 6B is a cross-sectional view of the structure taken generally along line 6B-6B in FIG. 5.
Figure 7:
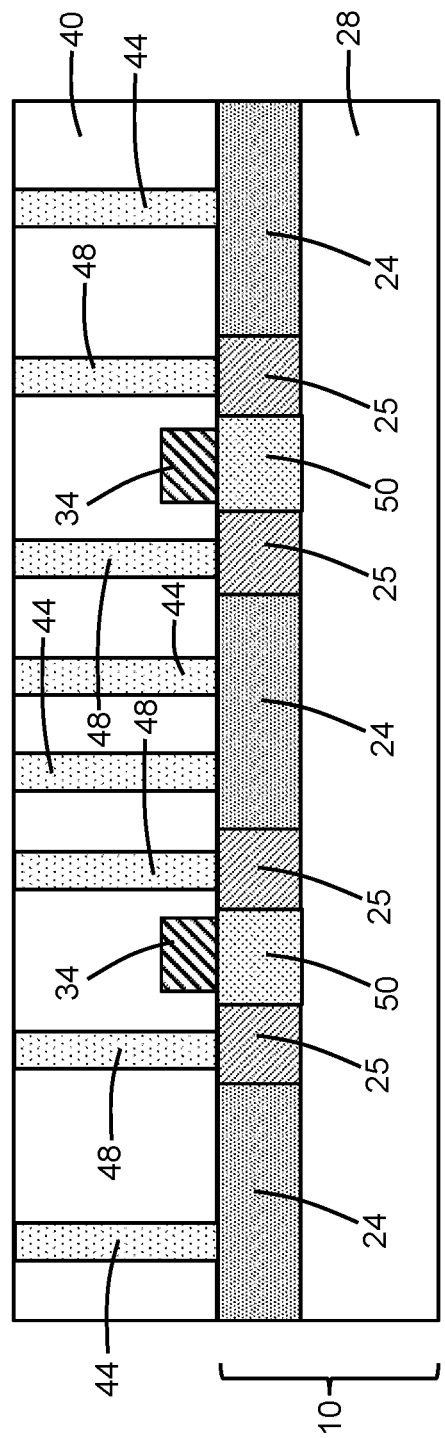
FIGS. 7, 7A, and 7B are cross-sectional views of the structure at a fabrication stage of the processing method subsequent to FIGS. 6, 6A, and 6B.
Figure 7A:
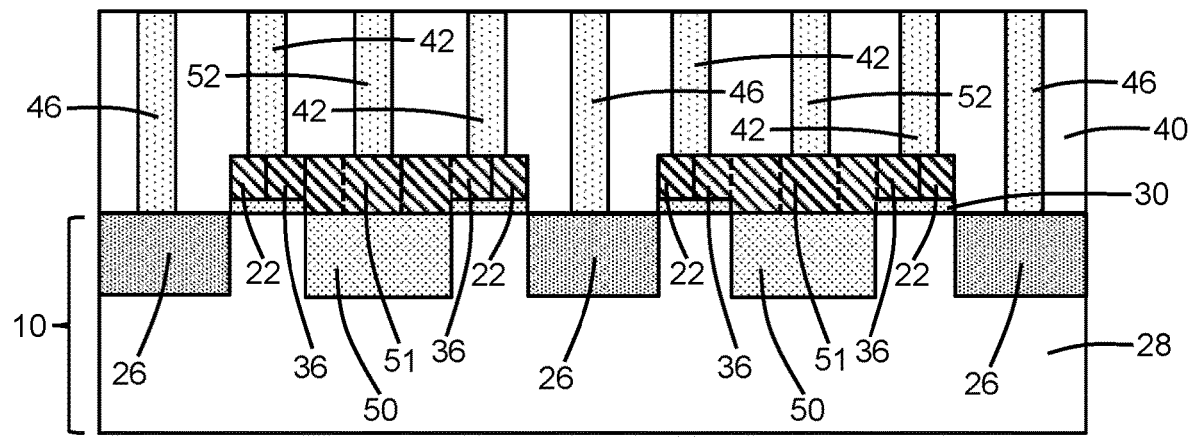
Figure 7B:
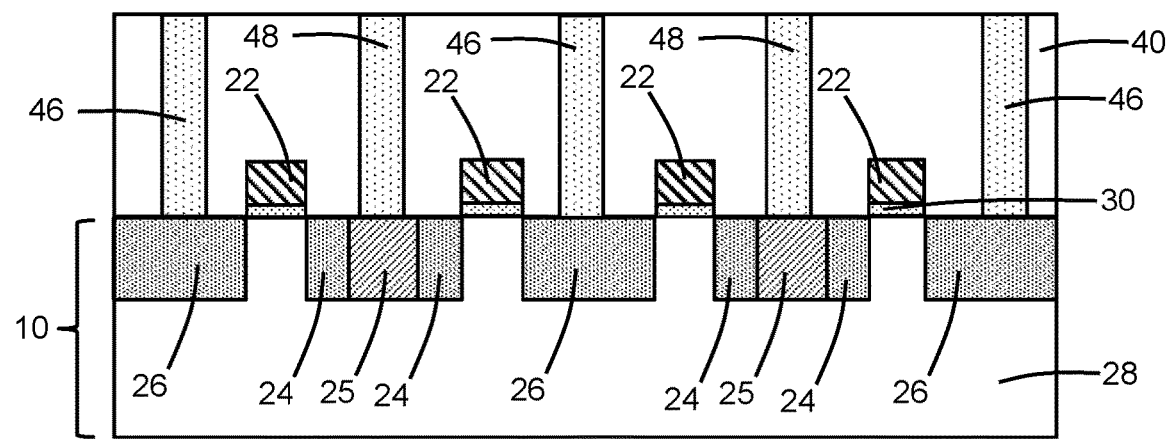

With reference to FIGS. 7, 7A, 7B in which like reference numerals refer to like features in FIGS. 6, 6A, and 6B and at a subsequent fabrication stage of the processing method, the local interconnect structure or contact level is formed by middle-of-line processing over the field-effect transistor 20. Additional gate contacts 52, which are also located over the active region, may penetrate through the dielectric layer 40 to land at a series of positions that are located on the enlarged section 51 added to the central section 34 of each gate extension 32. Each gate contact 52 may be in electrical and physical contact with the central section 34 of one of the gate extensions 32, which is positioned in a vertical direction between the gate contact 52 and the shallow trench isolation region 50 beneath the central section 34. The added gate contacts 52 may be effective to further reduce the gate resistance.

Figure 8:
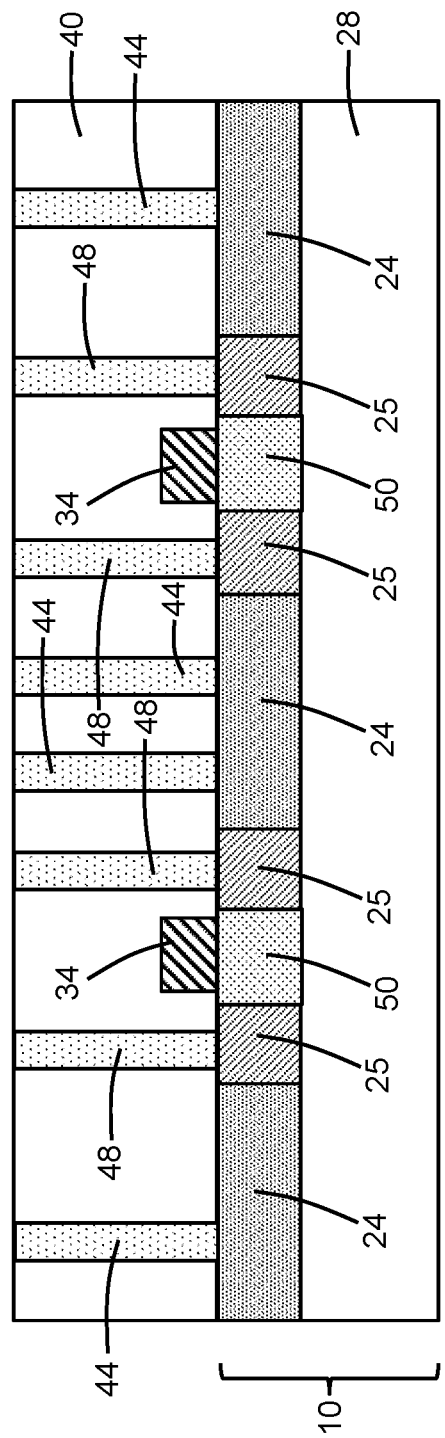
FIGS. 8, 8A, and 8B are cross-sectional views of a structure in accordance with alternative embodiments of the invention.
Figure 8A:
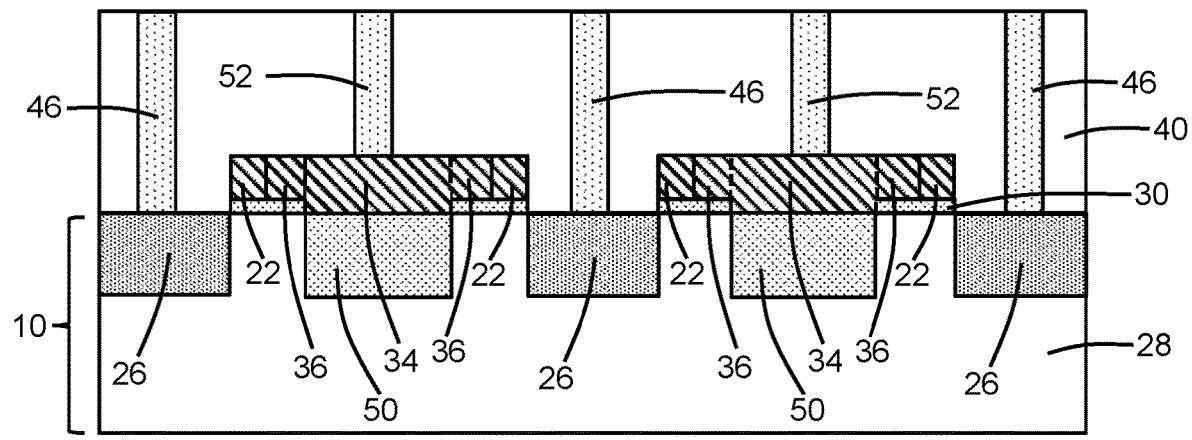
Figure 8B:
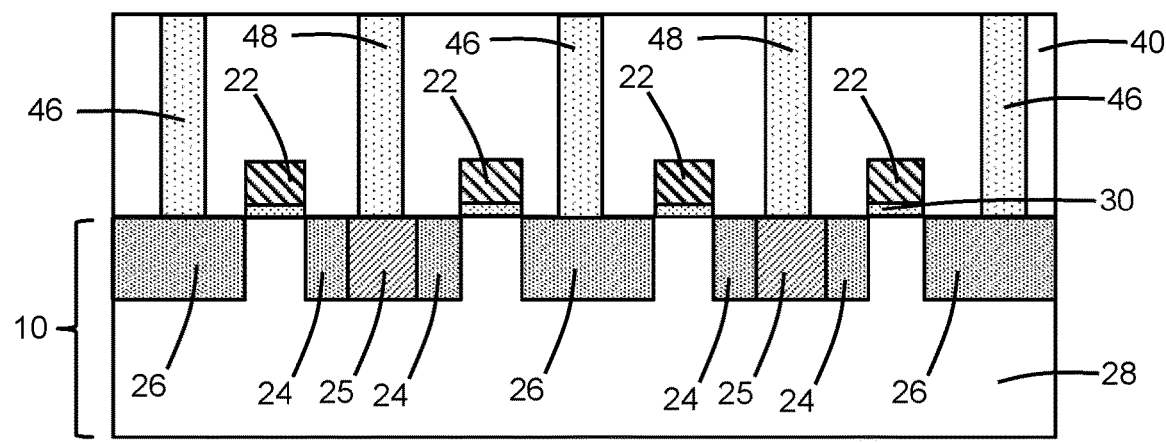

With reference to FIGS. 8, 8A, 8B and in accordance with alternative embodiments of the invention, the gate contacts 42 may be omitted to leave only the gate contacts 52, which are in electrical and physical contact with the central section 34 of the gate extensions 32. The gates 22 are electrically coupled to the gate contacts 52 by the gate extensions 32.

Figure 9:
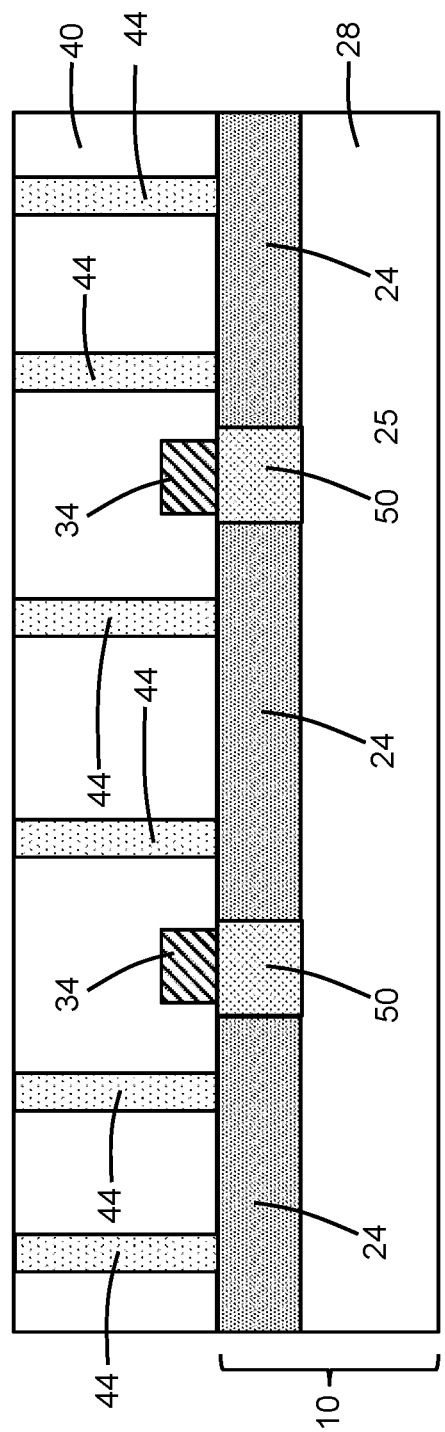
FIGS. 9, 9A, and 9B are cross-sectional views of a structure in accordance with alternative embodiments of the invention.
Figure 9A:
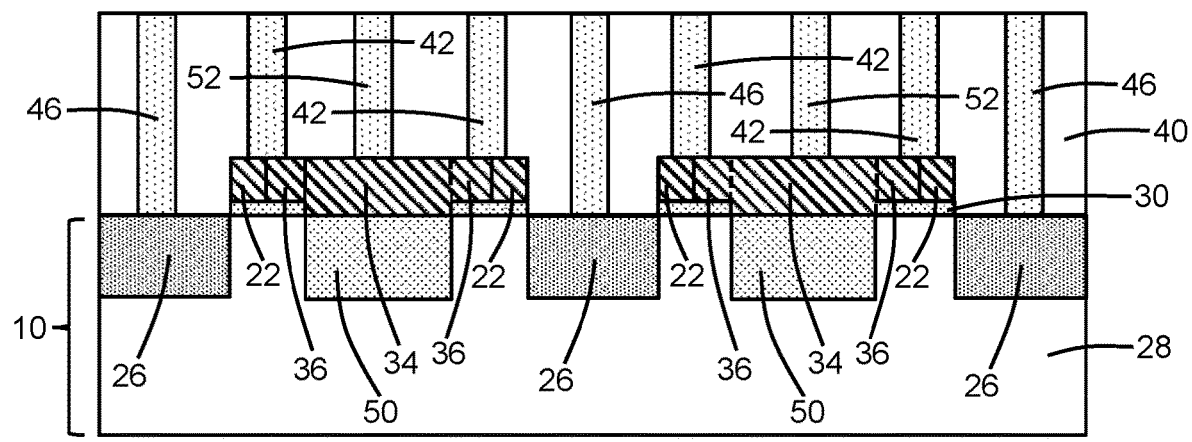
Figure 9B:
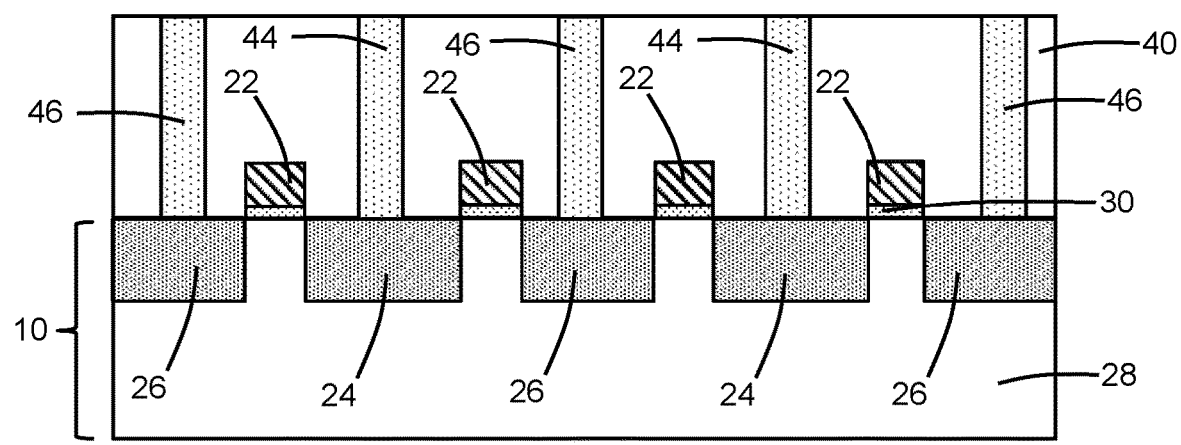

With reference to FIGS. 9, 9A, 9B and in accordance with alternative embodiments of the invention, the body contact regions 25 may be omitted from the device construction, and the gate extensions 32 may be uniformly doped to have the same conductivity type as the source regions 24 and the drain regions 26. In an embodiment, the elimination of the body contact regions 25 may be compatible with forming the device structure on a bulk substrate 10. In an alternative embodiment, the gate contacts 42 may be omitted to leave only the gate contacts 52 that are in electrical and physical contact with the central section 34 of the gate extensions 32.

Figure 10:
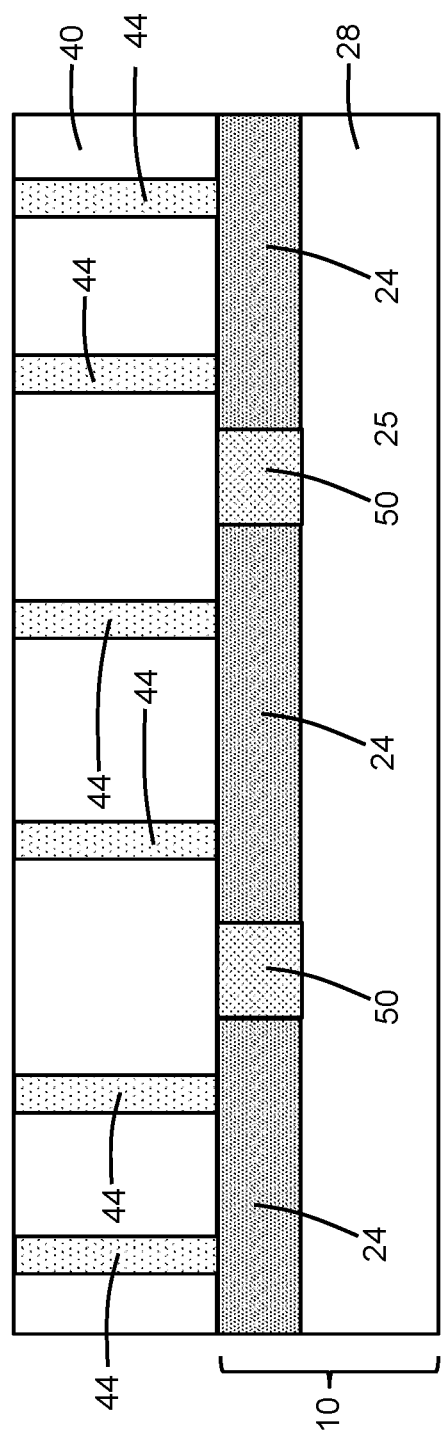
FIGS. 10, 10A, and 10B are cross-sectional views of a structure in accordance with alternative embodiments of the invention.
Figure 10A:
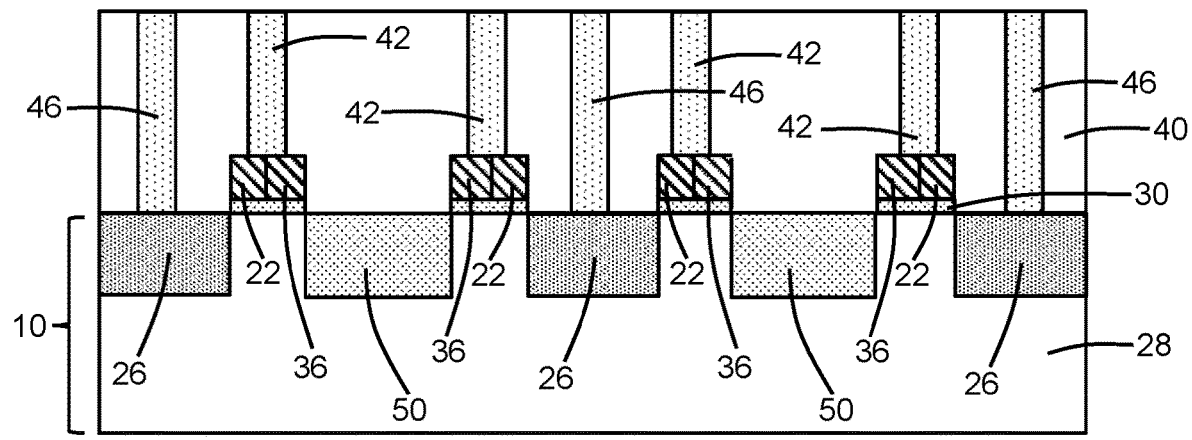
Figure 10B:
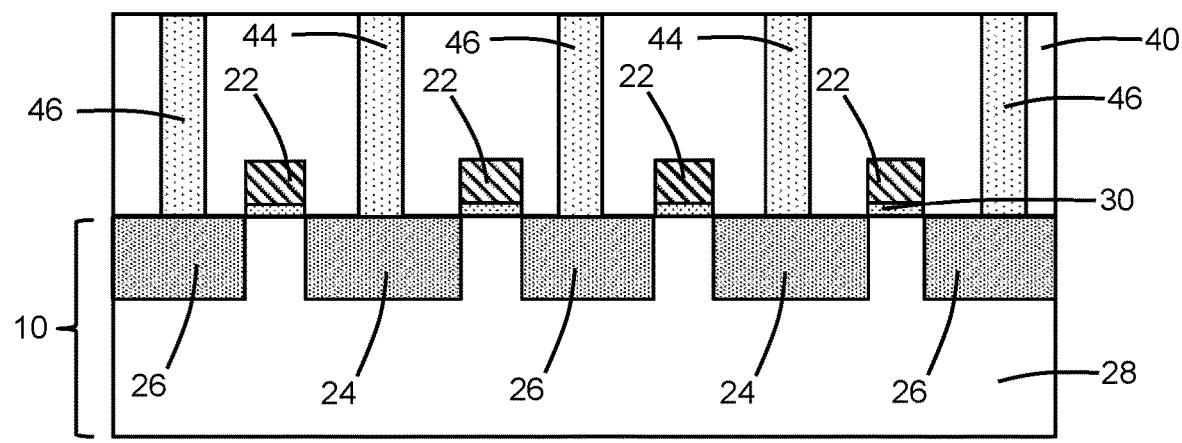

With reference to FIGS. 10, 10A, 10B and in accordance with alternative embodiments of the invention, the central section 34 of each gate extension 32 may be omitted from the device structure and only the enlarged sections 36 may remain. The enlarged sections 36 of each gate extension 32 are appended or adjoined to the sidewalls 21 of the adjacent gates 22, and are not connected to each other. Adjacent gates 22 are not connected to each other due to the elimination of the central section 34 of each gate extension 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate;
   a field-effect transistor including a first gate having a first sidewall, a second gate having a second sidewall adjacent to the first sidewall, a first gate extension having a first section adjoined to the first sidewall and a second section adjoined to the second sidewall, a second gate extension having a first section adjoined to the first sidewall and a second section adjoined to the second sidewall, a source region in the substrate between the first sidewall and the second sidewall, and a drain region in the substrate;
   a dielectric layer over the field-effect transistor;
   a first gate contact in the dielectric layer, the first gate contact in contact with the first section of the first gate extension;
   a second gate contact in the dielectric layer, the second gate contact in contact with the first section of the second gate extension; and
   a third gate contact in the dielectric layer, the third gate contact in contact with the second section of the first gate extension,
   wherein the first section of the first gate extension has a width dimension that decreases with increasing distance from the first sidewall, the second section of the first gate extension has a width dimension that decreases with increasing distance from the second sidewall, and the first section of the second gate extension has a width dimension that decreases with increasing distance from the first sidewall.

2. The structure of claim 1 wherein the first gate extension includes a third section that extends laterally from the first section to the second section such that the first section and the second section are connected, and the third section has a width dimension that is less than the width dimension of the first section and the width dimension of the second section of the first gate extension.

3. The structure of claim 2 wherein the third section of the first gate extension is positioned on a portion of the source region.

4. The structure of claim 3 wherein the field-effect transistor includes a body contact region that is positioned adjacent to the third section of the first gate extension, and the body contact region has an opposite conductivity type from the source region.

5. The structure of claim 2 further comprising:
   a shallow trench isolation region positioned in the substrate beneath the third section of the first gate extension.

6. The structure of claim 1 wherein the first gate contact includes a first portion in contact with the first section of the first gate extension and a second portion in contact with the first gate, the second gate contact includes a first portion in contact with the first section of the second gate extension and a second portion in contact with the first gate, and the third gate contact includes a first portion in contact with the second section of the first gate extension and a second portion in contact with the second gate.

7. The structure of claim 1 wherein the first gate contact includes a first portion in contact with the first section of the first gate extension and a second portion in contact with the first gate.

8. The structure of claim 1 wherein the first gate extension includes a third section that extends from the first section to the second section, and further comprising:
   a fourth gate contact in the dielectric layer, the fourth gate contact in contact with the third section of the first gate extension.

9. A structure comprising:
   a substrate;
   a field-effect transistor including a first gate having a first sidewall, a second gate having a second sidewall adjacent to the first sidewall of the first gate, a first gate extension having a first section adjoined to the first sidewall of the first gate and a second section adjoined to the second sidewall of the second gate, and a second gate extension having a first section adjoined to the first sidewall of the first gate and a second section adjoined to the second sidewall of the second gate, a source region in the substrate between the first sidewall and the second sidewall, and a drain region in the substrate;
   a first shallow trench isolation region beneath the first gate extension;
   a second shallow trench isolation region beneath the second gate extension;
   a first gate contact in a dielectric layer, the first gate contact in contact with the first gate extension;
   a second gate contact in the dielectric layer, the second gate contact in contact with the second gate extension; and
   a third gate contact in the dielectric layer, the third gate contact in contact with the second section of the first gate extension,
   wherein the first section of the first gate extension has a width dimension that decreases with increasing distance from the first sidewall, the second section of the first gate extension has a width dimension that decreases with increasing distance from the second sidewall, and the first section of the second gate extension has a width dimension that decreases with increasing distance from the first sidewall.

10. The structure of claim 9 wherein the first gate extension includes a a third section laterally arranged between the first section and the second section, and the third section has a width dimension that is less than the width dimension of the first section or the width dimension of the second section.

11. A method of forming a field-effect transistor, the method comprising:
   forming a first gate having a first sidewall, a second gate having a second sidewall adjacent to the first sidewall, a first gate extension having a first section adjoined to the first sidewall and a second section adjoined to the second sidewall, and a second gate extension having a first section adjoined to the first sidewall and a second section adjoined to the second sidewall;
   forming a source region in a substrate between the first sidewall and the second sidewall;

forming a drain region in the substrate;

forming a dielectric layer over the first gate, the first gate extension, the second gate, the second gate extension, the source region, and the drain region; and forming a first gate contact, a second gate contact, and a third gate contact in the dielectric layer, wherein the first gate contact is in contact with the first section of the first gate extension, the second gate contact is in contact with the first section of the second gate extension, the third gate contact is in contact with the second section of the first gate extension, the first section of the first gate extension has a width dimension that decreases with increasing distance from the first sidewall, the second section of the first gate extension has a width dimension that decreases with increasing distance from the second sidewall, and the first section of the second gate extension has a width dimension that decreases with increasing distance from the first sidewall.

12. The method of claim 11 wherein the first gate extension includes a third section between the first section and the second section, and the width dimension of the first section and the width dimension of the second section of the first gate extension are greater than a width dimension of the third section.

13. The structure of claim 1 wherein the substrate includes a well having a first conductivity type, the source region and the drain region have a second conductivity type different from the first conductivity type, the first gate is positioned over a first channel region of the well between the source region and the drain region, the second gate is positioned over a second channel region of the well between the source region and the drain region, the first gate extension is positioned over a first portion of the well, and the second gate extension is positioned over a second portion of the well.

14. The structure of claim 13 wherein the first gate extension includes a third section that extends laterally from the first section to the second section such that the first section and the second section are connected, and the first section and the second section of the first gate extension are larger in surface area than the third section.

15. The structure of claim 14 wherein the first gate and the second gate have the second conductivity type, the first section and the second section of the first gate extension have the second conductivity type, and the first section and the second section of the second gate extension have the second conductivity type.

16. The structure of claim 15 wherein the first section and the second section of the first gate extension have the second conductivity type, and the third section of the first gate extension has the first conductivity type.

17. The structure of claim 14 wherein the first section and the second section of the first gate extension have the second conductivity type, and the third section of the first gate extension has the first conductivity type.

* * * * *